United States Patent
Pedersen

(10) Patent No.: US 9,665,670 B1
(45) Date of Patent: May 30, 2017

(54) EMULATION OF SYNCHRONOUS PIPELINE REGISTERS IN INTEGRATED CIRCUITS WITH ASYNCHRONOUS INTERCONNECTION RESOURCES

(71) Applicant: Altera Corporation, San Jose, CA (US)

(72) Inventor: Bruce B. Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 1007 days.

(21) Appl. No.: 13/931,069

(22) Filed: Jun. 28, 2013

(51) Int. Cl.
*G06F 9/455* (2006.01)
*G06F 17/50* (2006.01)

(52) U.S. Cl.
CPC ...... *G06F 17/5022* (2013.01); *G06F 9/45508* (2013.01)

(58) Field of Classification Search
USPC ............................ 703/2, 22; 714/18; 710/305
See application file for complete search history.

(56) References Cited

U.S. PATENT DOCUMENTS

| | | | |
|---|---|---|---|
| 6,970,966 B2* | 11/2005 | Gemelli | G06F 17/5045 710/305 |
| 7,130,942 B2* | 10/2006 | Gemelli | G06F 17/5045 710/105 |
| 7,157,934 B2 | 1/2007 | Teifel et al. | |
| 7,464,361 B2 | 12/2008 | Sandbote | |
| 8,918,657 B2* | 12/2014 | Cameron | G06Q 50/06 713/300 |
| 2003/0101307 A1* | 5/2003 | Gemelli | G06F 17/5045 710/305 |
| 2005/0165995 A1* | 7/2005 | Gemelli | G06F 17/5045 710/305 |
| 2012/0198291 A1* | 8/2012 | Dubey | G11C 29/1201 714/718 |

* cited by examiner

*Primary Examiner* — Thai Phan
(74) *Attorney, Agent, or Firm* — Jason Tsai

(57) ABSTRACT

Integrated circuits may include synchronous nodes and asynchronous routing elements coupled between the synchronous nodes. A synchronous design implemented in such an integrated circuit may identify a register chain having a source register, a destination register, and intermediate registers. A virtual register may be created for each of the intermediate registers, which may then be removed from the synchronous design. The created virtual registers may be connected in series to form a virtual register chain between the source and destination registers. Each of the created virtual registers may be assigned to an asynchronous routing element that connects the source and destination registers on the integrated circuit. EDA tools such as viewers or a timing analysis tool may be configured to display the virtual registers instead of the asynchronous interconnection elements.

21 Claims, 8 Drawing Sheets

EMULATION OF SYNCHRONOUS PIPELINE REGISTERS IN INTEGRATED CIRCUITS WITH ASYNCHRONOUS INTERCONNECTION RESOURCES

BACKGROUND

This invention relates to integrated circuits such as programmable integrated circuits and more particularly, to emulating synchronous pipeline registers in integrated circuits with asynchronous interconnection elements.

Every transition from one technology node to the next technology node has resulted in smaller transistor geometries and thus potentially more functionality implemented per unit of integrated circuit area. Synchronous integrated circuits have further benefited from this development as evidenced by reduced delays between synchronous elements, which has led to increased clock speeds and thus to an increase in the throughput of signals. However, recent technology nodes have seen a significant decrease in the incremental reduction of delays between synchronous elements and thus to smaller incremental increase in throughput. To further increase the throughput, solutions comprising the introduction of synchronous pipeline registers have been proposed. However, synchronous pipeline registers are susceptible to clock skew issues, which may limit the amount by which the speed of a clock may be increased.

An alternative is to use asynchronous interconnection elements. An asynchronous interconnection element conveys a signal from one asynchronous interconnection element to the next only when the next asynchronous interconnection element or the destination node is free to accept the signal. However, designing with asynchronous interconnection elements is difficult, and many design engineers are unfamiliar with asynchronous designs.

SUMMARY

In accordance with some embodiments of the present invention, an integrated circuit may include synchronous elements connected by asynchronous routing elements. A synchronous design describing such an integrated circuit may identify a register chain in the synchronous design, wherein the register chain includes a source register, a destination register, and at least one intermediate register and wherein each of the intermediate registers is connected in series between the source and destination registers (e.g., each of the intermediate registers are pipeline registers). A virtual register may be created for each of the intermediate registers. Each of the created virtual registers may further be connected in series to form a virtual register chain having a first virtual register and a last virtual register, and the virtual register chain may be coupled between the source and destination registers.

It is appreciated that the present invention can be implemented in numerous ways, such as a process, an apparatus, a system, a device, or a method on a computer readable medium. Several embodiments of the present invention are described below.

In certain embodiments, each of the intermediate registers may be removed from the synchronous design. If desired, at least one asynchronous handshaking element may be inserted between the data output of the source register and the data input of the destination register and an asynchronous handshaking acknowledge signal may be asserted at each clock cycle of the clock signal at the destination register.

If desired, the source and destination registers each include a data input, a clock input, and at least one control input. A control signal may be provided to the source register. This control signal may be delayed by a time delay to produce a delayed control signal, and the delayed control signal may be provided to the destination register.

Further features of the invention, its nature and various advantages, will be more apparent from the accompanying drawings and the following detailed description of the preferred embodiments.

DETAILED DESCRIPTION

The present invention relates to integrated circuits such as programmable integrated circuits and more particularly, to emulating synchronous pipeline registers in integrated circuits with asynchronous interconnection elements.

As previously described, recent technology nodes have seen a significant slow-down in the reduction of delays between synchronous elements and thus to a slow-down in the throughput increase. Using asynchronous interconnection elements may provide a suitable solution. However, designing with asynchronous interconnection elements is difficult, and many design engineers are unfamiliar with asynchronous designs.

It may be desirable to provide computer-aided design (CAD) tools that support emulating a synchronous design or portions of a synchronous design implemented in an integrated circuit that comprises synchronous elements and asynchronous interconnection elements.

Figure 1:
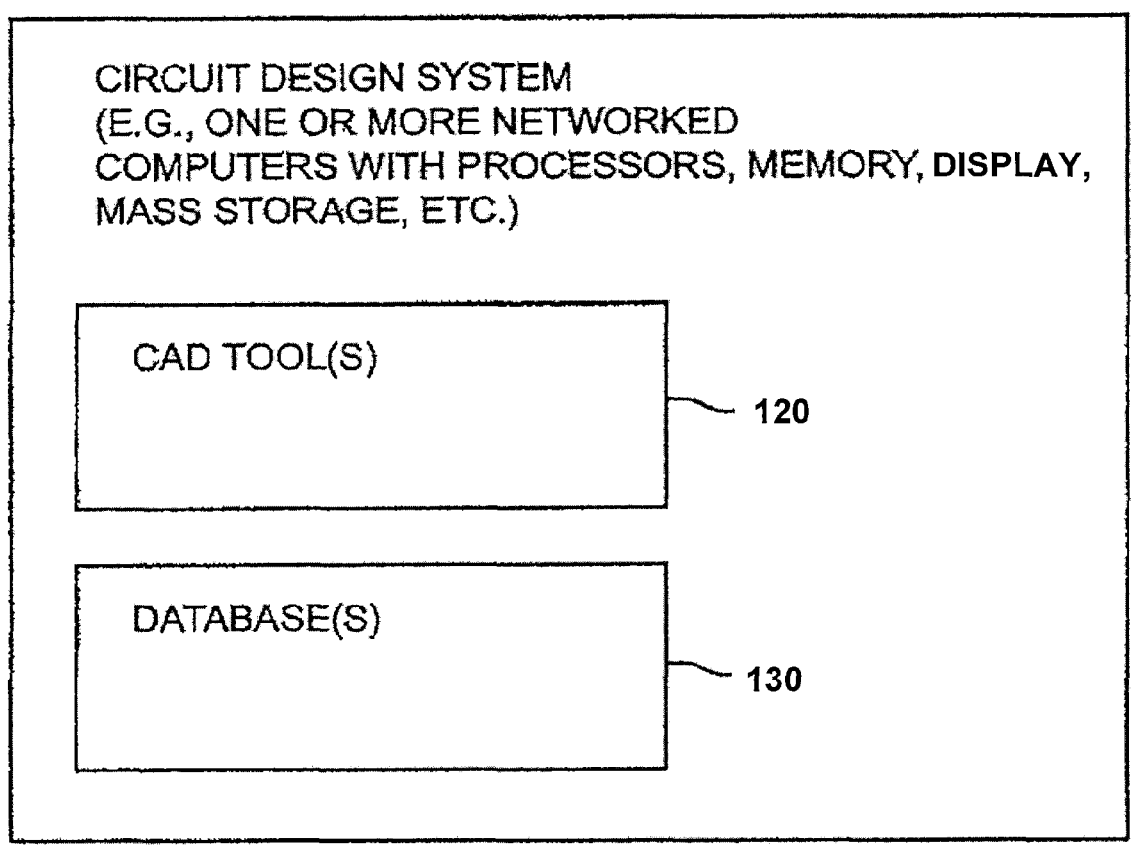
FIG. 1 is a diagram of an illustrative logic design system for generating configuration data for implementing custom circuit designs in accordance with an embodiment of the present invention.

An illustrative logic design system 100 in accordance with the present invention is shown in FIG. 1. System 100 may be based on one or more processors such as personal computers, workstations, etc. The processor(s) may be linked using a network (e.g., a local or wide area network). Memory in these computers or external memory and storage devices such as internal and/or external hard disks and/or server storage such as server storage provided in data centers or in the "cloud" may be used to store instructions and data. A display may be used to visualize tasks executed by the processor(s) or information stored in memory.

Software-based components such as computer-aided design tools 120 and databases 130 reside on system 100. During operation, executable software such as the software of computer-aided design tools 120 runs on the processor(s) of system 100. Databases 130 are used to store data for the operation of system 100. In general, software and data may be stored on any computer-readable medium (storage) in system 100. Such storage may include computer memory chips, removable and fixed media such as hard disk drives, flash memory, compact discs (CDs), DVDs, Blu-ray discs, other optical media, and floppy diskettes, tapes, or any other suitable memory or storage device(s). When the software of system 100 is installed, the storage 600 of system 100 has instructions and data that cause the computing equipment in system 100 to execute various methods (processes). When performing these processes, the computing equipment is configured to implement the functions of the logic design system.

The computer-aided design (CAD) tools 120, some or all of which are sometimes referred to collectively as a CAD tool may be provided by a single vendor or multiple vendors. Tools 120 may be provided as one or more suites of tools (e.g., a compiler suite for performing tasks associated with implementing a circuit design in a programmable logic device) and/or as one or more separate software components (tools). Database(s) 130 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

Figure 2:
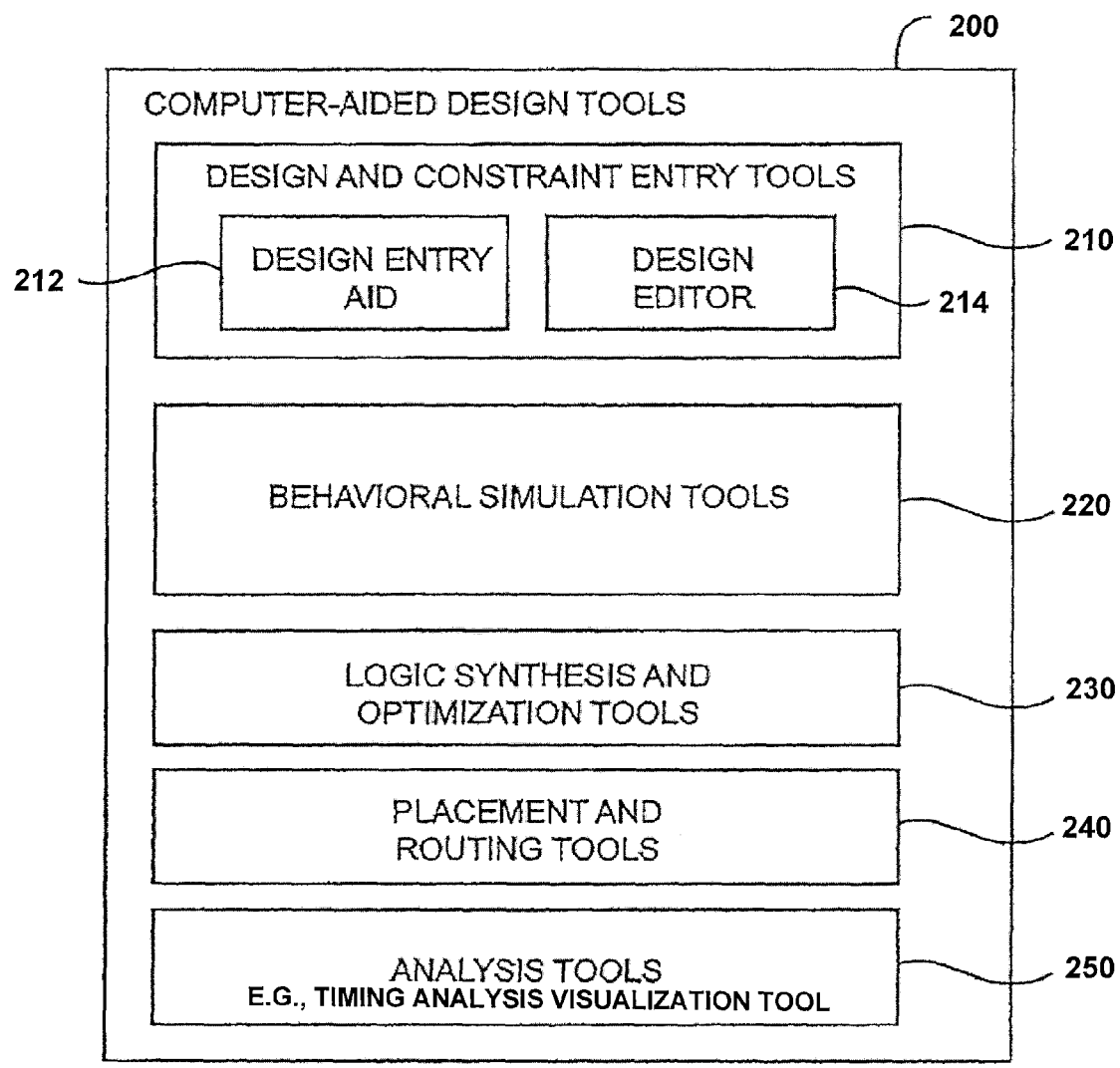
FIG. 2 is a diagram of illustrative computer-aided design (CAD) tools that may be used in a logic design system in accordance with an embodiment of the present invention.

Illustrative computer-aided design tools 200 that may be used in a logic design system such as computer-aided design tools 120 in system 100 of FIG. 1 are shown in FIG. 2.

The design process typically starts with the formulation of logic circuit functional specifications (e.g., a functional description of the logic circuit). A logic designer can specify how a desired circuit should function using design and constraint entry tools 210. Design and constraint entry tools 210 may include tools such as design and constraint entry aid 212 and design editor 214. Design and constraint entry aids such as design entry aid 212 may be used to help a logic designer locate a desired design from a library of existing logic designs and may provide computer-aided assistance to the logic designer for entering (specifying) the desired design.

As an example, design and constraint entry aid 210 may be used to present screens of options for a user. The user may click on on-screen options to select whether the circuit being designed should have certain features. Design editor 214 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 210 may be used to allow a logic designer to provide a desired logic design description using any suitable format. For example, design and constraint entry tools 210 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 210 may allow the logic designer to provide a logic design to the logic design system 100 using a hardware description language such as Verilog hardware description language (HDL) or Very High Speed Integrated Circuit Hardware Description Language (VHDL). The designer of the logic circuit can enter the logic design by writing hardware description language code with design editor 214. Blocks of code may be imported from user-maintained or commercial libraries if desired.

After the design has been entered using design and constraint entry tools 210, behavioral simulation tools 220 may be used to simulate the functional performance of the design. If the functional performance of the design is incomplete or incorrect, the logic designer can make changes to the design using design and constraint entry tools 210. The functional operation of the new design can be verified using behavioral simulation tools 220 before synthesis operations have been performed using tools 230. Simulation tools such as tools 220 may also be used at other stages in the design flow if desired (e.g., after logic synthesis). The output of the behavioral simulation tools 220 may be provided to the logic designer in any suitable format (e.g., truth tables, timing diagrams, etc.).

Once the functional operation of the logic design has been determined to be satisfactory, logic synthesis and optimization tools 230 may be used to implement the logic design. For example, the logic design may be mapped to a given standard cell library or mapped to the logic and interconnect resources of a particular programmable logic device product or product family.

Tools 230 may attempt to optimize the design by making appropriate selections of hardware to implement different logic functions in the logic design based on the logic design data and constraint data entered by the logic designer using design and constraint entry tools 210. After logic synthesis and optimization using tools 230, the logic design system may use computer-aided design tools such as placement and routing tools 240 to perform physical design steps (layout synthesis operations). Placement and routing tools 240 are used to determine the arrangement and interconnection of each gate in a synthesized netlist on a given integrated circuit. For example, placement and routing tools 240 may assign each gate in the synthesized netlist to a logic function and determine the routing channels and the setting of routing multiplexers that connect the logic function in the event that the given integrated circuit is a programmable logic device. For example, if two counters interact with each other, the placement and routing tools 240 may place the two counters next to each other, (e.g., locating these counters in adjacent logic regions on a programmable logic device to reduce interconnect delays or to satisfy timing requirements specifying the maximum permitted interconnect delay). The placement and routing tools 240 create orderly and efficient physical implementations of logic designs.

Tools such as tools 230 and 240 may be part of a compiler suite (e.g., part of a suite of compiler tools provided by a CAD tool vendor or a programmable logic device vendor). In accordance with the present invention, tools such as tools 230, 240, and 250 automatically take into account the effects of crosstalk between interconnects while implementing a desired circuit design. Tools 230, 240, and 250 may also include timing analysis tools such as timing estimators. This allows tools 230 and 240 to satisfy performance requirements (e.g., timing requirements) when generating configuration data. A timing analysis tool may also include a timing analysis visualization tool to graphically display the information derived from timing analysis. Analysis tools 250 may include other analysis tools as well such as power analysis tools or viewer tools, just to name a few.

After an implementation of the desired logic design has been generated using placement and routing tools 240, the implementation of the design may be analyzed and tested using analysis tools 250. After satisfactory optimization operations have been completed using computer-aided design tools 200, computer-aided design tools 200 may produce the configuration data, which may include a programming stream for a programmable logic device, a set of mask designs for an application specific integrated circuit (ASIC), a mask programmable integrated circuit, etc.

Figure 3:
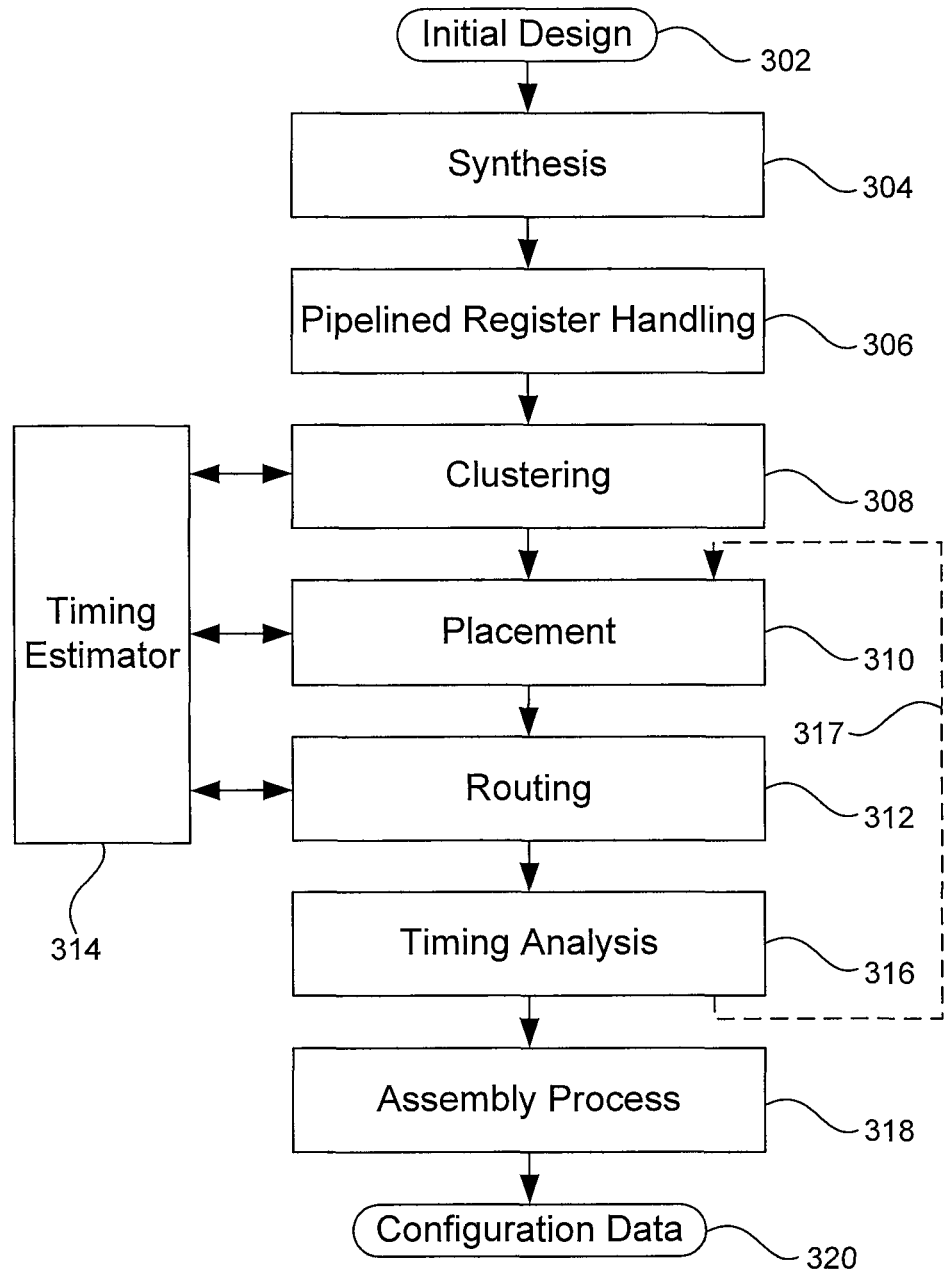
FIG. 3 is a flow chart of illustrative steps for designing a custom logic circuit in accordance with an embodiment of the present invention.

Illustrative operations involved in using computer-aided design tools 200 of FIG. 2 to produce final designs are shown in FIG. 3. As shown in FIG. 3, an initial design 302 may be provided (e.g., by a user) for synthesis during step 304. The initial design may include a description of hardware (e.g., using a hardware description language, schematic descriptions, or other suitable forms of describing circuit functions). During step 304, the hardware description of the initial design may be synthesized into a netlist by mapping the hardware description to hardware resources. For example, custom functions described in the initial design may be mapped to a standard cell library or to look-up table circuitry and registers in the synthesized netlist.

The custom functions described in the synthesized netlist may include registers that are used for register pipelining (e.g., to accommodate critical path delay requirements). During the operations of step 306, a logic design system such as logic design system 100 of FIG. 1 may analyze the synthesized netlist and/or the initial hardware description to identify potential register pipelines. For example, user descriptions such as macros, synthesis attributes, pragmas, or other key words may identify registers that are associated with register pipelining.

If desired, the synthesized netlist and initial hardware description may be analyzed for register pipelining using one or more rules that may be matched against registers in the synthesized netlist. As an example, a rule may be defined that matches registers that are coupled in series by interconnects (e.g., the rule may identify series of interconnected registers). If desired, the rule may exclude registers that are known to be shift registers or other types of registers that are not used for register pipelining. As another example, a rule may be defined that matches registers that receive the same clock signal. A logic design system such as logic design system 100 of FIG. 1 may use the rule to identify registers that are each controlled by a clock signal.

During step 306, the logic design system may remove all identified pipeline registers between the first and last synchronous register of each pipelined signal path. In the scenario that the first and last synchronous register receive control signals, such as asynchronous reset, enable, or preset signals, just to name a few, step 306 may insert logic to time delay the respective control signals between the first and last synchronous register of a pipelined signal path. The time delay by which the control signals are delayed may be based on a number of clock cycles in the synchronous design. For example, the time delay may be equal to the number of removed pipelining registers multiplied by the clock cycle time. In the event that two or more pipelined paths have the same number of pipeline registers and the same clock and control signals, the logic inserted to delay the control signals between first and last synchronous registers of a pipelined path may be shared between some or all of these different pipelined paths.

During step 306, the logic design system may also annotate the data connection between the first and last synchronous register of a pipelined path such that any data signal sent from the first synchronous register will be conveyed to the last synchronous register via asynchronous interconnection elements. Step 306 may further add acknowledgement logic to the last synchronous register to assert an acknowledge signal on every clock cycle. The acknowledgement logic may be shared between multiple pipeline paths that use the same synchronous clock and synchronous clock enable signals.

If desired, the logic design system may create a virtual register for each of the removed pipeline registers. The logic design system may associate each virtual register with an asynchronous interconnection element. Computer-aided design tools of the logic design system such as computer-aided design tools 200 of FIG. 2 may manipulate virtual registers in a similar fashion as other logic in the synchronous design. For example, virtual registers may be displayed in viewer tools. Virtual registers may be accessed by floor planning tools. Virtual registers may also be manipulated in timing analysis tools. For example, a user may assign timing constraints to the virtual registers, and visualize the virtual registers in the output reports produced by the timing analysis tools. Providing a method for implementing a synchronous design description using asynchronous circuitry allows the user to benefit from a potentially higher performance architecture (i.e., an asynchronous circuit implementation) while maintaining a synchronous design paradigm which most designers are already familiar with.

During the operations of step 308, the logic design system may perform clustering operations to organize the synthesized netlist into a structure suitable for implementation in an integrated circuit. For example, smaller entities such as logic gates and registers may be grouped to form larger clusters for more efficient subsequent handling of the netlist.

Registers in the synthesized netlist that have been identified as intermediate registers in a register pipeline and removed from the synthesized netlist (e.g., during step 306) are excluded from the clustering process of step 308. In other words, the excluded registers may not be included in any of the groups (clusters) formed during step 308.

The logic design system may include a timing estimator 314 (e.g., formed as part of optimization tools 230, tools 240, or tools 250) that may be used to estimate routing delays between signal sources and corresponding signal destinations. For example, timing estimator 314 may be used to estimate routing delays between synchronous elements (e.g., based on the lengths of interconnects, cell delays, etc.). The routing delays may, if desired, be estimated based on metrics such as slack (e.g., the difference between a required arrival time and the actual arrival time of a signal), slack-ratios (e.g., the slack divided by the clock period), interconnect congestion, or other timing metrics. The logic design system may use the estimated routing delays to determine the locations of groups of circuitry on the inetegrated circuit while helping to ensure that routing delays satisfy timing requirements (e.g., critical path delay requirements) or other performance constraints.

During the operations of step 310, the logic design system may perform a placement process in which the locations of the groups (clusters) of circuitry are determined (e.g., in programmable logic devices, which programmable logic regions are configured as the groups of circuitry). The placement process of step 310 may be performed to map custom user functions from the synthesized netlist to regions of circuitry on the integrated circuit.

During the operations of step 312, the logic design system may determine how to interconnect signal sources and signal destinations. The logic design system may produce a final netlist using the results of steps 310 and 312.

During the operations of step 316, the logic design system may perform a timing analysis on the final netlist. The timing analysis may be used to help ensure that the final netlist satisfies timing constraints. If desired, the process may return to step 310 via optional path 317 to perform optimizations using the final netlist. For example, the logic design system may identify routing paths in the final netlist that fail timing constraints and determine replacement routing paths by returning to step 310 via optional path 317.

In step 318, the final netlist may be processed further during an assembly process to produce configuration data 320. In the scenario where the target device is an ASIC, the configuration data may include a set of masks. Alternatively, if the design process targets an implementation on a programmable logic device, the configuration data may, for example, be a .pof or .sof file which may then be loaded onto a programmable integrated circuit.

Asynchronous circuitry has many desirable characteristics. For example, asynchronous circuitry works without a clock signal, and the speed at which asynchronous circuitry operates is limited only by the propagation delay between asynchronous elements. However, asynchronous circuitry may be more challenging to design. For example, asynchronous circuitry may have potential race conditions, many designers are unfamiliar with asynchronous design techniques, and many legacy designs such as intellectual property (IP) core designs are synchronous designs.

Figure 4:
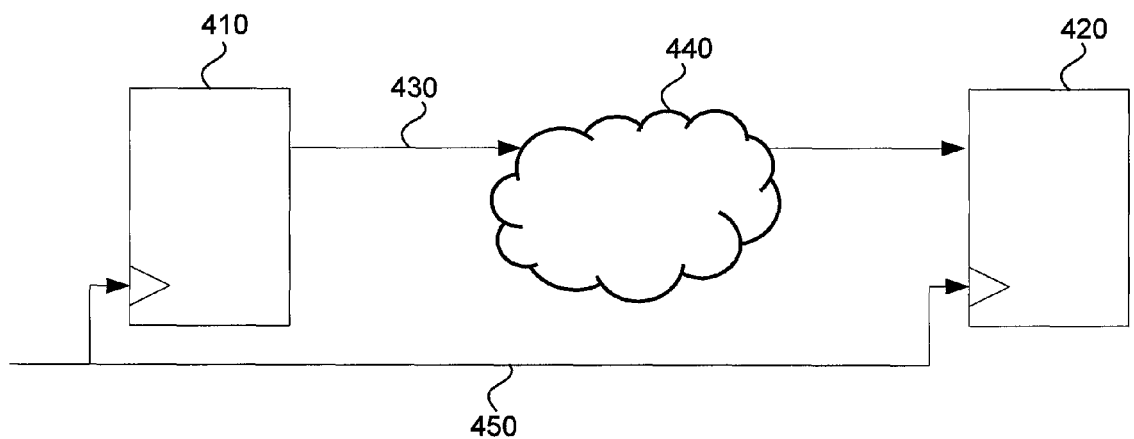
FIG. 4 is a diagram of an illustrative synchronous circuit in accordance with an embodiment of the present invention.

An illustrative diagram of a synchronous circuit is shown in FIG. 4. A synchronous circuit is characterized by one or more clock signals such as clock signal 450, synchronous storage elements such as registers 410 and 420 that are controlled by the clock signal, interconnects coupled between the synchronous elements (e.g., interconnect 430) to convey signals between synchronous elements, and combinational logic such as combinational logic 440 that may implement any desired logic function or combinations of logic functions.

Dedicated clock lines, sometimes also referred to as a clock tree, may distribute clock signals to all regions of an integrated circuit. A clock tree may have dedicated connections that reduce the skew between different branches of the tree in an attempt to achieve simultaneous arrival of a clock signal at all the different sequential elements that are controlled by that clock signal. The clock signal may trigger the sequential elements to store data signals available at their inputs. For example, a register may store a new data signal in response to receiving a rising edge of the clock signal at the register's clock input. Alternatively, a register may store a new data signal whenever a falling clock edge of the clock signal arrives at the register's clock input.

Consider the scenario where registers 410 and 420 are both rising clock edge triggered registers controlled by the same clock signal 450. In this scenario, a signal that is stored in register 410 at a rising clock edge and conveyed over interconnection 430 and through combinational logic 440 to register 420 is required to arrive at the data input of register 420 a given amount of time before the next rising edge of the clock signal reaches register 420. This given amount of time is sometimes also referred to as setup time (Tsu). The data signal at the data input 420 also needs to be stable for an additional amount of time after the rising edge of the clock signal has reached register 420. This additional amount of time is sometimes also referred to as hold time (Th). Setup time (Tsu) and hold time (Th) of a register may be defined for example in a data sheet or a library file. Setup time and hold time may also vary significantly depending on ambient temperature, supply voltage, and process technology.

Figure 5:
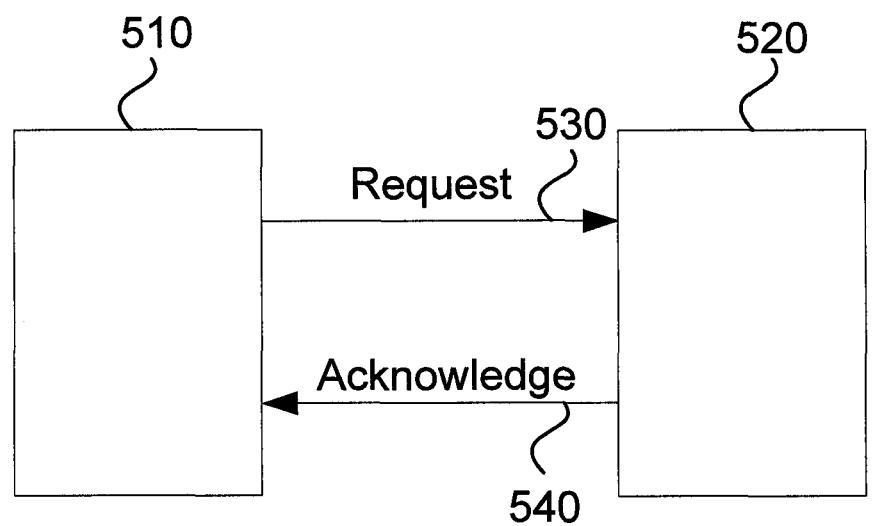
FIG. 5 is a diagram of an illustrative asynchronous circuit in accordance with an embodiment of the present invention.

Unlike in synchronous circuits, the execution of operations in asynchronous circuits is not dependent on a periodic clock signal. Instead, operations may be invoked by event signals generated by control logic. FIG. 5 shows an illustrative diagram of an asynchronous circuit comprising communicating elements such as sender 510 and receiver 520, and event signals such as request 530 and acknowledge 540. A series of event signals sent back and forth between communicating elements is sometimes also referred to as a handshake.

Asynchronous circuits may communicate via handshakes. For example, sender 510 may initiate a handshake sequence. For this purpose, sender 510 may send a request signal 530 to receiver 520. Receiver 520 may carry out the requested operation and, after completing the operation, send an acknowledge signal 540 back to sender 510. Upon receipt of the acknowledge signal 540, sender 510 may carry on with the next operation. Request signal 530 and acknowledge signal 540 are events on wires. Such events may be identified via transition signaling such as rising or falling signal edges or level signaling.

Figure 6A:
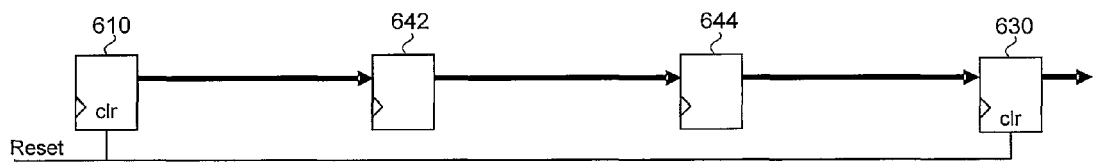
FIG. 6A is an illustrative diagram of four registers forming a register pipeline in accordance with an embodiment of the present invention.

Consider the scenario where a synchronous design such as a register pipeline shown in FIG. 6A is implemented in an integrated circuit having synchronous nodes and asynchronous interconnect elements. The register pipeline may include a source register 610, a destination register 630, and intermediate registers 642 and 644. Source register 610 and destination register 630 may receive an asynchronous control signal such as a reset signal. This register pipeline may be implemented more efficiently (i.e., with improved performance) using asynchronous routing instead of intermediate routing registers 642 and 644.

Figure 6B:
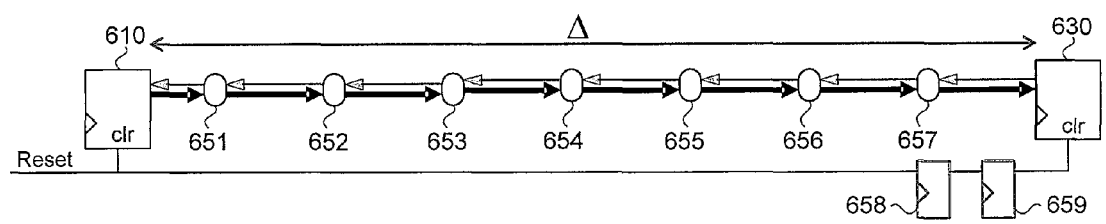
FIG. 6B is an illustrative diagram of asynchronous handshake elements in between the source and destination registers of a register pipeline in accordance with an embodiment of the present invention.

A possible implementation of the register pipeline from FIG. 6A in an integrated circuit having synchronous registers and asynchronous interconnect elements is shown in FIG. 6B. A design system may remove intermediate registers 642 and 644 between the source register 610 and the destination register 630 from the design of FIG. 6A (e.g., during step 306 of FIG. 3).

Consider the scenario in which the source register and the destination register are configured to receive asynchronous control signals (e.g., an asynchronous reset signal). In the scenario that an asynchronous reset was triggered and released, source register 610 and destination register 630 may resume normal operation at the next active clock edge. A data signal received at source register 610 after the release of the asynchronous reset is stored in source register 610 at the next active clock edge. In the configuration of FIG. 6A, the data signal then propagates to the destination register 630, where the data signal is stored three clock ticks later assuming that registers 610, 642, 644, and 630 are all triggered by the same edge of the same clock signal. In the configuration of FIG. 6B, the data signal may propagate from source register 610 to destination register 630 in less than three clock cycles (e.g., in zero, one, or two clock cycles) and stored at the destination register 630 on the next active clock edge after arrival. In order to ensure equivalent behavior between the configurations in FIGS. 6A and 6B, the destination register 630 may need to delay the release of the asynchronous reset signal such that normal operation resumes three clock ticks after the release of the asynchronous reset signal. In order to delay the return to normal operation after the release of an asynchronous control signal, the design system may insert logic such as registers 658 and 659 to time delay the respective control signals between the source and destination registers.

During step 306 of FIG. 3, the design system may also annotate the data connection between the first and last synchronous register of a pipelined path such that any data signal sent from the first synchronous register will be conveyed to the last synchronous register via asynchronous interconnection elements 651, 652, 653, 654, 655, 656, and 657.

The implementation of the register pipeline from FIG. 6A in an integrated circuit having synchronous registers and asynchronous interconnect elements as shown in FIG. 6B is merely illustrate and is not intended to limit the scope of the present invention. If desired, the design system may remove any number of pipeline registers between the source and destination registers and may use any arbitrary number of asynchronous interconnection elements.

Figure 6C:
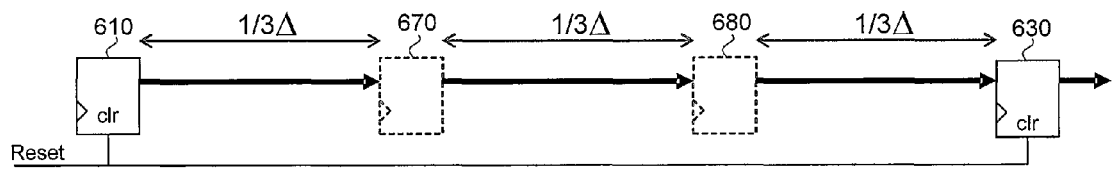
FIG. 6C is an illustrative diagram of a register pipeline with registers between the source and destination registers of the register pipeline being replaced by virtual registers in accordance with an embodiment of the present invention.

The design system may further create a virtual register for each of the removed pipeline registers such as illustrated in FIG. 6C. For example, during step 306 of FIG. 3, the design system may create virtual register 670 and 680 and insert them between source register 610 and destination register 630. Step 306 may associate each virtual register with an asynchronous interconnection element. For example, virtual register 670 may be associated with asynchronous interconnection element 652, and virtual register 680 may be associated with asynchronous interconnection element 655. Thus, the creation of virtual registers allows a user to work in a design paradigm using pipelining that he is already familiar with.

As explained above, virtual registers may be manipulated in a timing analysis tools. For example, a user may assign timing constraints to virtual registers 670 and 680 using the timing analysis tools. The timing analysis tools may provide a visual representation of the virtual registers in the output reports produced by the timing analysis tools. The timing analysis tools may distribute the estimated delay between source and destination register onto the virtual registers. For example, as shown in FIG. 6C, one third of the delay may be assigned to the interconnection between source register 610 and virtual register 670, one third of the delay may be assigned to the interconnection between virtual registers 670 and 680, and one third of the delay may be assigned to the interconnection between virtual register 680 and destination register 630.

Figure 7:
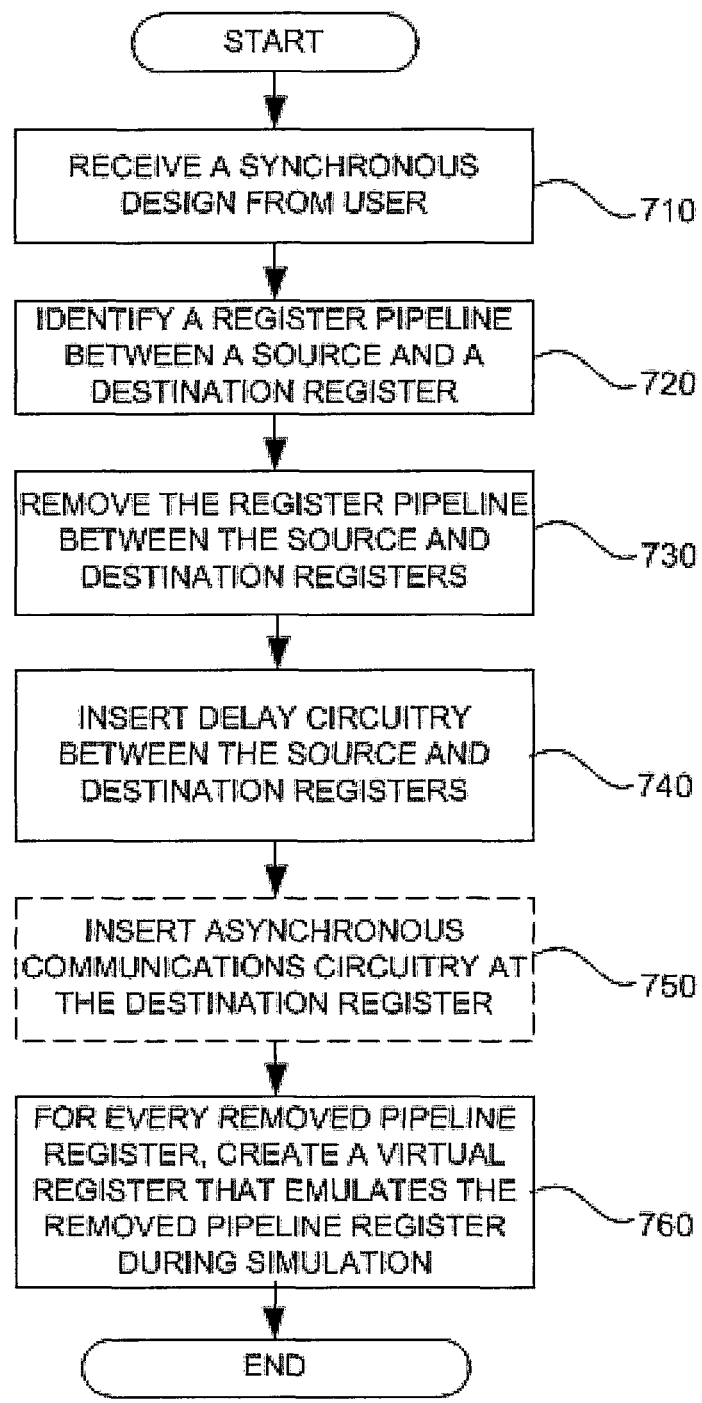
FIG. 7 is a flow chart of illustrative steps for emulating intermediate registers between the first and last registers of a pipeline stage by virtual registers in accordance with an embodiment of the present invention.

FIG. 7 shows a flow chart of illustrative steps that may be performed by a circuit design system to implement a synchronous design on an integrated circuit having synchronous nodes and asynchronous interconnect elements.

During step 710, the circuit design system may receive a synchronous design (e.g., from a user), and may subsequently identify intermediate registers coupled in a chain between a source and a destination register in the synchronous design during step 720. Such intermediate registers that are coupled in a chain are sometimes also referred to as a register pipeline. The circuit design system may identify such a register pipeline based on labeled portions of the design. Alternatively, the circuit design system may identify a register pipeline by parsing the synchronous design in search for registers that are connected to another register. The circuit design system may parse the synchronous design in different ways. For example, the circuit design system may conduct a depth-first search, a breadth-first search or any combination thereof to identify registers that are connected to other registers.

During step 730, the circuit design system may remove the register pipelines between each pair of source and destination registers. In the event that a source and destination register have common control signals such as asynchronous reset or clock enable signals, the circuit design system may insert delay circuitry during step 740 to delay the arrival of the respective control signals at the destination register by a given amount of time. For example, the arrival of the respective control signals at the destination register may be delayed to correspond to the number of removed intermediate registers multiplied by the clock period.

During step 750, the circuit design system may insert logic at the destination register to assert the asynchronous handshaking acknowledge signal. This step is optional and only required if such logic doesn't exist at the destination register. During step 760, the circuit design system may create a virtual register for every removed pipeline register. These virtual pipeline registers may emulate the removed pipeline registers during simulation.

Figure 8:
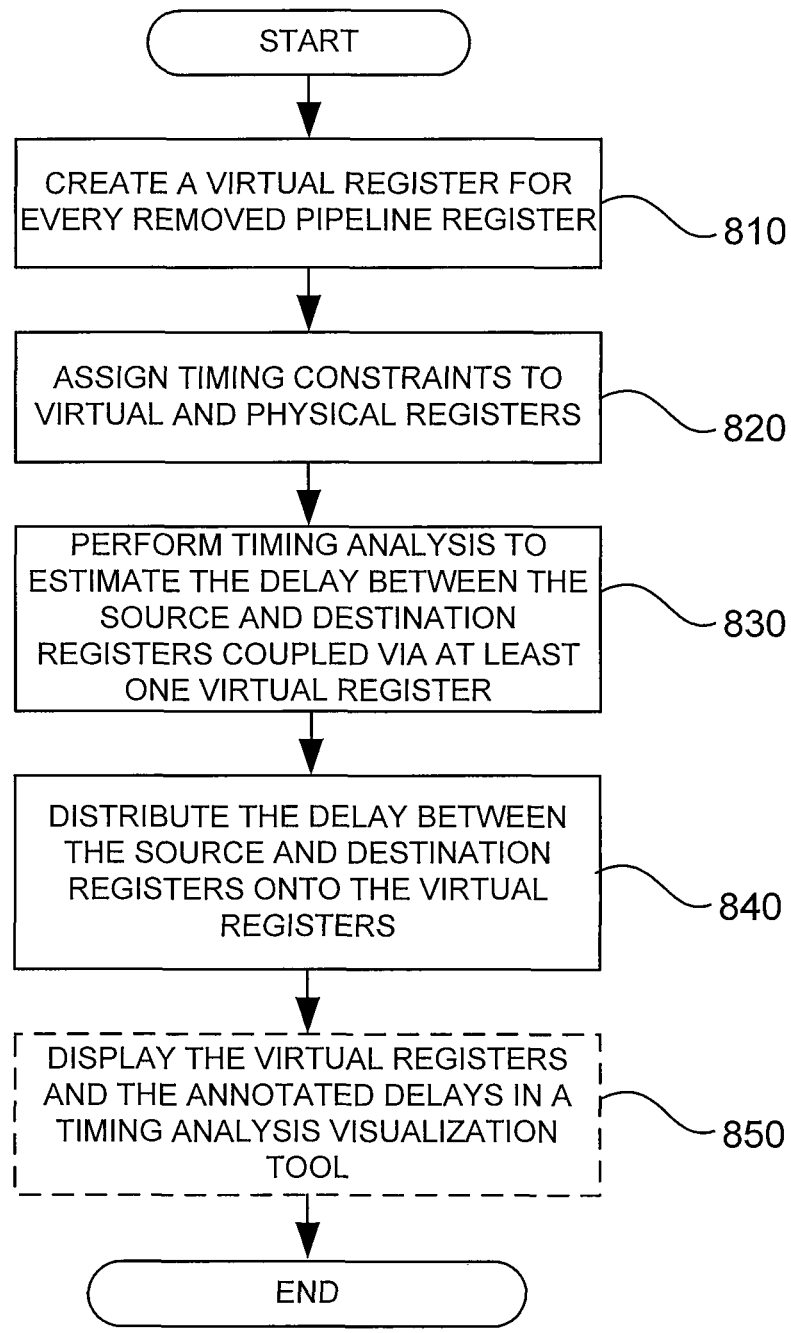
FIG. 8 is a flow chart of illustrative steps for performing timing analysis of a register pipeline in which all registers between the first and last registers have been replace by virtual registers in accordance with an embodiment of the present invention.

Computer-aided design tools may manipulate and process virtual registers as if they were physical registers. A flow chart of illustrative steps that a circuit design system may perform to generate and process virtual registers during timing analysis is shown in FIG. 8. The circuit design system may create a virtual register for every removed pipeline register during step 810. During step 820, the circuit design system may assign timing constraints that were originally assigned to the removed pipeline registers or between the source and destination registers to the virtual registers. A timing analysis tool may estimate the delay between the source and destination registers during step 830, and the timing analysis tool may distribute the delay among the connections between the source register, the virtual registers, and the destination register during step 840. For example, the timing analysis tool may distribute the total delay between source and destination registers equally between all virtual registers and annotate those virtual registers accordingly. Alternatively, the timing analysis tool may annotate partial delays to the interconnections between the source register and the first virtual register, the virtual registers, and the last virtual register and the destination register. The circuit design system may display the virtual registers and the annotated delays using a timing analysis visualization tool during optional step 850.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method for operating a synchronous design on an integrated circuit, the method comprising:
   receiving a synchronous design;
   identifying a register chain in the synchronous design, wherein the register chain includes a source register, a destination register, and at least one intermediate register and wherein each of the at least one intermediate register is connected in series between the source and destination registers;
   creating a virtual register for each of the at least one intermediate register;
   removing each of the at least one intermediate register from the synchronous design; and
   coupling asynchronous routing elements between the source and destination registers.

2. The method of claim 1 further comprising:
   connecting each of the created virtual register in series to form a virtual register chain having a first virtual register and a last virtual register; and
   coupling the virtual register chain between the source and destination registers.

3. The method of claim 2, wherein the source register includes a data output, wherein the destination register includes a data input, the method further comprising:
   inserting at least one asynchronous handshaking element between the data output of the source register and the data input of the destination register.

4. The method of claim 3, wherein the destination register is controlled by a clock signal, the method further comprising:

asserting an asynchronous handshaking acknowledge signal at each clock cycle of the clock signal at the destination register.

5. The method of claim 3 further comprising:
   associating one of the virtual registers with one of the asynchronous routing elements.

6. The method of claim 2, wherein the source and destination registers each include a data input, a clock input, and at least one control input, the method further comprising:
   providing a control signal to the source register;
   delaying the control signal by a time delay to produce a delayed control signal; and
   providing the delayed control signal to the destination register.

7. The method of claim 6, wherein the source register is controlled by a clock signal received at the clock input of the source register, the method further comprising:
   determining the time delay based on a clock period of the clock signal.

8. The method of claim 7, wherein determining the time delay comprises determining the time delay based on a length of the register chain.

9. A method for analyzing a synchronous user design to be implemented as an integrated circuit, the method comprising:
   identifying a register pipeline in the synchronous user design;
   replacing a subset of registers of the register pipeline with at least one asynchronous routing element;
   inserting a virtual register for each register in the subset of registers; and
   modeling the register pipeline with the inserted virtual registers based on the at least one asynchronous routing element.

10. The method of claim 9 further comprising:
    displaying the virtual registers in a visualization tool.

11. The method of claim 10, wherein the register pipeline includes a source register, a destination register, and at least one intermediate register, and wherein the source and destination registers are assigned to synchronous registers on the integrated circuit.

12. The method of claim 11 further comprising:
    assigning timing constraints to the source and destination registers.

13. The method of claim 12 further comprising:
    assigning timing constraints to each of the virtual registers.

14. The method of claim 12, wherein emulating the register pipeline with at least one virtual register further comprises:
    creating a plurality of edges, wherein each edge has one fanin and one fanout, wherein one edge is created for the destination register, and wherein one edge is created for each of the virtual registers; and
    connecting the source and destination registers and the virtual registers using the plurality of edges, wherein the source and destination registers are adjacent to one of the plurality of edges, and wherein each of the virtual registers is adjacent to two of the plurality of edges.

15. The method of claim 14, wherein the implementation of the synchronous user design as the integrated circuit connects the source and destination registers through a subset of the plurality of asynchronous routing elements, the method further comprising:
    estimating a delay between the source and destination registers based on signal propagation time from the source register through the subset of the plurality of asynchronous routing elements to the destination register.

16. The method of claim 15 further comprising:
partitioning the delay between the source and destination registers into portions based on the plurality of edges; and
assigning each portion of the delay to a respective edge of the plurality of edges.

17. The method of claim 16, wherein a given virtual register of the virtual registers is associated with a timing constraint and wherein the given virtual register has an input that is coupled to a given edge of the plurality of edges, the method further comprising:
partitioning the delay between the source and destination registers into portions based on the plurality of edges and the timing constraint; and
assigning each portion of the delay to a respective edge of the plurality of edges so that the given edge coupled to the input of the given virtual register fulfills the timing constraint.

18. A non-transitory computer-readable storage medium for emulating a logic design including at least one synchronous register pipeline for implementing on an integrated circuit having asynchronous routing elements, wherein the synchronous register pipeline includes a plurality of registers, and wherein each of the plurality of registers has a data input port and a data output port, the non-transitory computer-readable storage medium comprising instructions for:
identifying a first register of the plurality of registers, wherein the data input port of the first register is coupled to the data output port of a second register of the plurality of registers, and wherein the data output port of the first register is coupled to the data input port of a third register of the plurality of registers;
inserting one of the asynchronous routing elements between the data output port of the second register and the data input port of the third register;
creating a virtual register; and
associating the virtual register with the one of the asynchronous routing elements.

19. The non-transitory computer-readable storage medium defined in claim 18, wherein the third register has a clock port that receives a clock signal and a control input port that receives a control signal, the non-transitory computer-readable storage medium further comprising instructions for:
delaying the control signal received at the control input port of the third register by one clock cycle of the clock signal.

20. The non-transitory computer-readable storage medium defined in claim 19 further comprising instructions for:
assigning timing constraints from the first register to the virtual register.

21. The non-transitory computer-readable storage medium defined in claim 19 further comprising instructions for:
estimating the delay from the data output port of the second register through the one of the asynchronous routing elements to the data input port of the third register;
assigning a first portion of the delay to the first edge; and
assigning a second portion of the delay to the second edge.

* * * * *